US011835555B2

(12) United States Patent
Olson et al.

(10) Patent No.: US 11,835,555 B2
(45) Date of Patent: Dec. 5, 2023

(54) MULTIPLE WATTHOUR METER ASSEMBLY

(71) Applicant: E.J. Brooks Company, Novi, MI (US)

(72) Inventors: Justin A. Olson, Flat Rock, MI (US); Donghui Donna Wang, Bloomfield Hills, MI (US); Robert F. Kiessling, Waterford, MI (US)

(73) Assignee: E.J. Brooks Company, Novi, MI (US)

( * ) Notice: Subject to any disclaimer, the term of this patent is extended or adjusted under 35 U.S.C. 154(b) by 0 days.

(21) Appl. No.: 17/342,913

(22) Filed: Jun. 9, 2021

(65) Prior Publication Data

US 2022/0397592 A1 Dec. 15, 2022

(51) Int. Cl.
*G01R 22/06* (2006.01)
(52) U.S. Cl.
CPC ................... *G01R 22/065* (2013.01)
(58) Field of Classification Search
CPC .... G01R 22/06–10; G01R 11/02; G01R 11/04
See application file for complete search history.

(56) References Cited

U.S. PATENT DOCUMENTS

| 2,076,492 | A | * | 4/1937 | Allen | G01R 11/04 361/660 |
| 3,366,845 | A | * | 1/1968 | Esler | G01R 11/04 361/660 |
| 4,133,021 | A | * | 1/1979 | King | G01F 15/14 73/201 |
| 4,532,574 | A | * | 7/1985 | Reiner | G01R 11/04 361/660 |
| 5,006,076 | A | | 4/1991 | Robinson et al. | |
| 5,184,279 | A | * | 2/1993 | Horn | H02G 9/10 362/85 |
| 5,246,286 | A | * | 9/1993 | Huebschen | F16B 12/08 312/249.8 |
| 5,870,276 | A | * | 2/1999 | Leach | H02B 1/03 361/825 |
| 6,595,330 | B1 | * | 7/2003 | Henrickson | B66F 17/00 187/277 |
| 6,975,504 | B2 | | 12/2005 | Robinson et al. | |
| 7,040,920 | B2 | * | 5/2006 | Johnson, Jr. | G01R 22/065 439/146 |
| 7,616,420 | B2 | * | 11/2009 | Slater | H02H 9/042 361/103 |
| 2003/0117128 | A1 | * | 6/2003 | Dadian | G01R 22/065 324/142 |
| 2006/0021395 | A1 | * | 2/2006 | Ely | E05B 65/0089 70/164 |
| 2007/0192817 | A1 | * | 8/2007 | Landry | G02B 6/4457 725/120 |
| 2011/0198865 | A1 | * | 8/2011 | DeWalch | E05B 65/0888 292/2 |
| 2011/0313694 | A1 | * | 12/2011 | Hampel | G01D 4/008 702/62 |

(Continued)

*Primary Examiner* — Huy Q Phan
*Assistant Examiner* — David B Frederiksen
(74) *Attorney, Agent, or Firm* — Vedder Price P.C.

(57) ABSTRACT

An assembly includes a housing having an inner panel and an outer panel. The housing defines a chamber between the inner panel and the outer panel. The outer panel defines a plurality of openings open to the chamber. The assembly includes a plurality of meter blocks supported by inner panel of the housing within the chamber, the meter blocks at the openings.

17 Claims, 5 Drawing Sheets

(56) References Cited

U.S. PATENT DOCUMENTS

| | | | |
|---|---|---|---|
| 2012/0139270 A1* | 6/2012 | Gentile | E05B 65/0089 |
| | | | 292/259 R |
| 2013/0328545 A1 | 12/2013 | Rudaitis et al. | |
| 2016/0187449 A1* | 6/2016 | Beiner | G01R 35/04 |
| | | | 324/74 |
| 2016/0359308 A1* | 12/2016 | Vezina | H02G 3/22 |
| 2017/0146287 A1* | 5/2017 | Rezayat | F25D 13/00 |
| 2017/0359918 A1* | 12/2017 | Klaba | H05K 5/0247 |
| 2018/0198249 A1 | 7/2018 | Olson et al. | |
| 2020/0011910 A1* | 1/2020 | Teboulle | G01R 25/00 |

* cited by examiner

MULTIPLE WATTHOUR METER ASSEMBLY

BACKGROUND

Buildings and other structures are typically electrically connected to an electrical grid that delivers power from a utility power source to the building. The utility power source may be, for example, a coal plant, a nuclear plant, a hydro-electric dam, a solar farm, a wind farm, etc. An electrical meter is installed at an electrical connection of the building to the electrical grid. The electrical meter, also known as a watthour meter, measures an amount electrical power consumed at the build and supplied via the electrical grid. The amount of measured electrical power may be used to determine how much a consumer should be billed by an operator of the utility power source.

DETAILED DESCRIPTION

Figure 1:
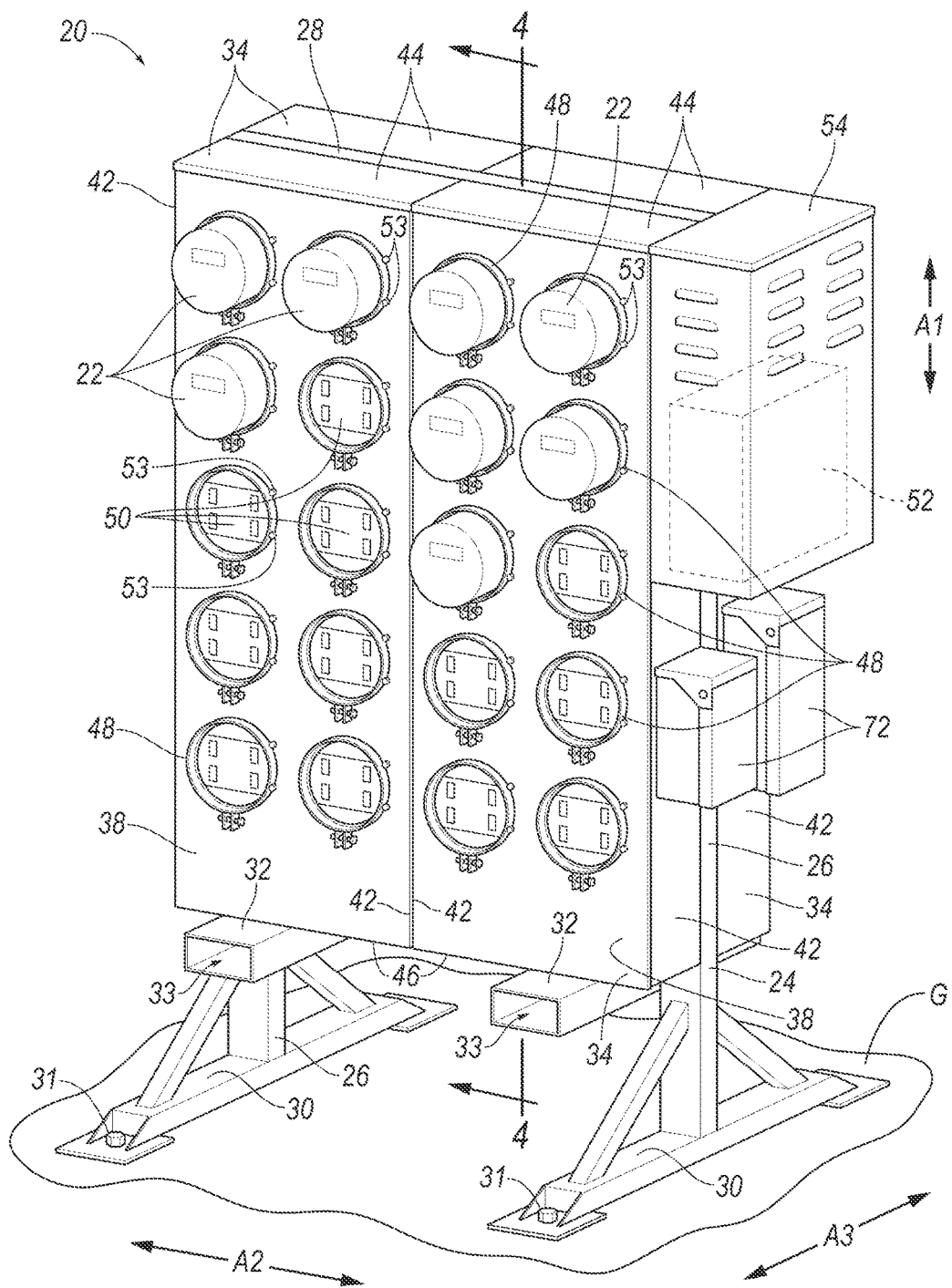
FIG. 1 is a front perspective view of an assembly with multiple electric power meters and outer panels in closed positions.

An assembly for connection of multiple electric power meters includes a housing having an inner panel and an outer panel. The housing defining a chamber between the inner panel and the outer panel. The outer panel defines a plurality of openings open to the chamber. The assembly includes a plurality of meter blocks supported by inner panel of the housing within the chamber at the openings of the outer panel. The assembly may, for example, provide a structure for testing (other otherwise using) multiple electric power meters that is efficient to manufacture and transport. Specifically, the assembly may be moveable between locations without need for disassembly or reassembly of the meter blocks, the housing, the panels, etc., and may be freestanding and easily secured at the locations.

With reference to the Figures, wherein like numerals indicate like parts throughout the several views, an assembly 20 for connection of multiple electric power meters 22 is shown. The assembly 20 may be used as a test bank for the meters 22, e.g., to verify calibration and/or test other characteristics of the meters 22.

Each meter 22 measures an amount of electric power that flows therethrough, e.g., in watt-hours. For example, the meter 22 may be an electromechanical induction meter that operates through electromagnetic induction. The meter 22 may be electronic, and include a power supply, a metering engine, a processing and communication engine (i.e., a microcontroller), and other add-on modules such as a real time clock (RTC), a liquid crystal display, infra-red communication ports/modules and so on. The meter 22 may be able to be read remotely, e.g., via low-power radio, GSM, GPRS, Bluetooth, IrDA, cellular, Zigbee, WiFi, telephone lines or over a power grid. The meter 22 may include a pair of line connectors that can receive electric power and a pair of load connectors that can provide electric power. Electric power received at the line connectors is transmitted through the meter 22 to the load connectors. The meter 22 measures an amount of electric power that flows from the line connectors to the load connectors. The line connectors and the load connectors of the meter 22 may be male connectors. For example, the line connectors and the load connectors may each include a blade or other suitable structure for insertion into a female connector. The blades may extend outside of a housing of the meter 22.

The assembly 20 may include a frame 24 that supports other components of the assembly 20. The frame 24 may include a pair of main beams 26 elongated along a vertical axis A1 and spaced from each other a lateral axis A2. The frame 24 may include one or more cross beams 28 elongated along the lateral axis A2 and spaced from each other along the vertical axis A1. The cross beams 28 may be fixed to the main beams 26.

The frame 24 includes a pair of feet 30 that support the assembly 20 in a freestanding position. In other words, the feet 30 sufficiently support the assembly 20 so as to not require attaching the assembly 20 to a separate structure, such as a building or the like. The feet 30 may be elongated along a longitudinal axis A3. The feet 30 may be fixed to the main beams 26. The feet 30 may be releasably fixed, e.g., via a bolt 31 or other suitable structure, to ground G on which the assembly is placed 20. For example, bolts 31 may extend downward through the feet 30 and engage with concrete ground G under the feet 30. The bolts 31 may be installed when the assembly 20 is secured at a location and removed to enable transport of the assembly 20 to a different location.

The frame 24 may include a pair of fork receivers 32. The fork receivers 32 are sized to receive forks, e.g., of a forklift, and enable transport of the assembly 20. For example, the fork receivers 32 may each include a hollow beam with an open end 33. Forks of the forklift may be received in the open ends 33 and disposed with the hollow beams. The fork receivers 32 may be elongated along the longitudinal axis A3, e.g., parallel to the feet 30. The frame 24, e.g., the main beams 26, the cross beams 28, the feet 30, and the fork receivers 32, may be rectangular tube steel, or any suitable material. The vertical axis A1, the lateral axis A2, and the longitudinal axis A3 are perpendicular to each other.

The assembly 20 includes one or more housings 34 for supporting the meters 22. One or more of the housings 34 may be fixed to opposite sides of the frame 24 as one or more other housings 34, e.g., with the main beams 26 and the cross beams 28 therebetween along the longitudinal axis A3. One or more of the housings 34 may be at a common side of the frame 24.

Each housing 34 has an inner panel 36 and an outer panel 38. The inner panels 36 are spaced from the outer panels 38, e.g., along the longitudinal axis A3. A chamber 40 is defined by each housing 34, e.g., between each of the inner panels 36 and the outer panels 38. Each housing 34 may include a pair of side panels 42. The side panels 42 may extend from the inner panel 36 to the outer panel 38. The side panels 42 may be spaced from each other, e.g., along the lateral axis A2. The chambers 40 may be defined between the side panels 42. Each housing 34 may include a top panel 44 and a bottom panel 46. The top panel 44 may be spaced from the bottom panel 46, e.g., along the vertical axis A1. The chamber 40 may be defined between the top panel 44 and the bottom panel 46. The panels 36, 38, 42, 44, 46 may be sheet metal, or any suitable material.

The inner panels 36 of the housings 34 may be fixed to the frame 24 outside the chamber 40. For example, the main beams 26 and the cross beams 28 may be between the inner panels 36 of the housings 34 and opposite the respective outer panels 38. The main beams 26 and the cross beams 28 may be fixed to the inner panels 36 via weld, fastener, etc.

The outer panels 38 of the housings 34 each define a plurality of openings 48 open to the chamber 40. The openings 48 are sized to receive the meters 22, e.g., such that the meters 22, or a portion thereof, can be inserted into the chamber 40 via the openings 48. For example, the openings 48 may be larger than the meters 22. The openings 48 may be circular, or any suitable shape.

Figure 2:
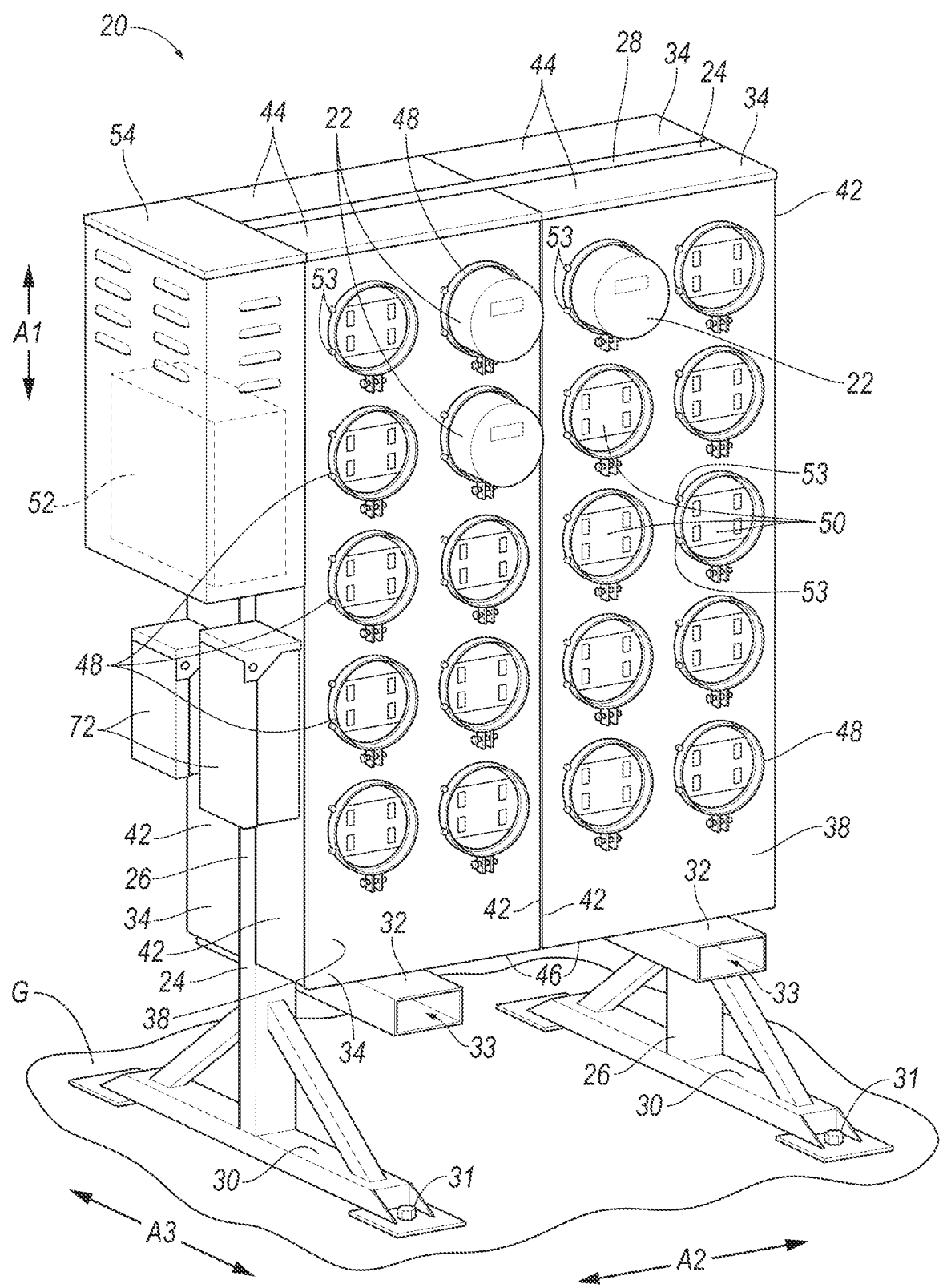
FIG. 2 is a rear perspective view of the assembly with multiple electric power meters and outer panels in closed positions.
Figure 3:
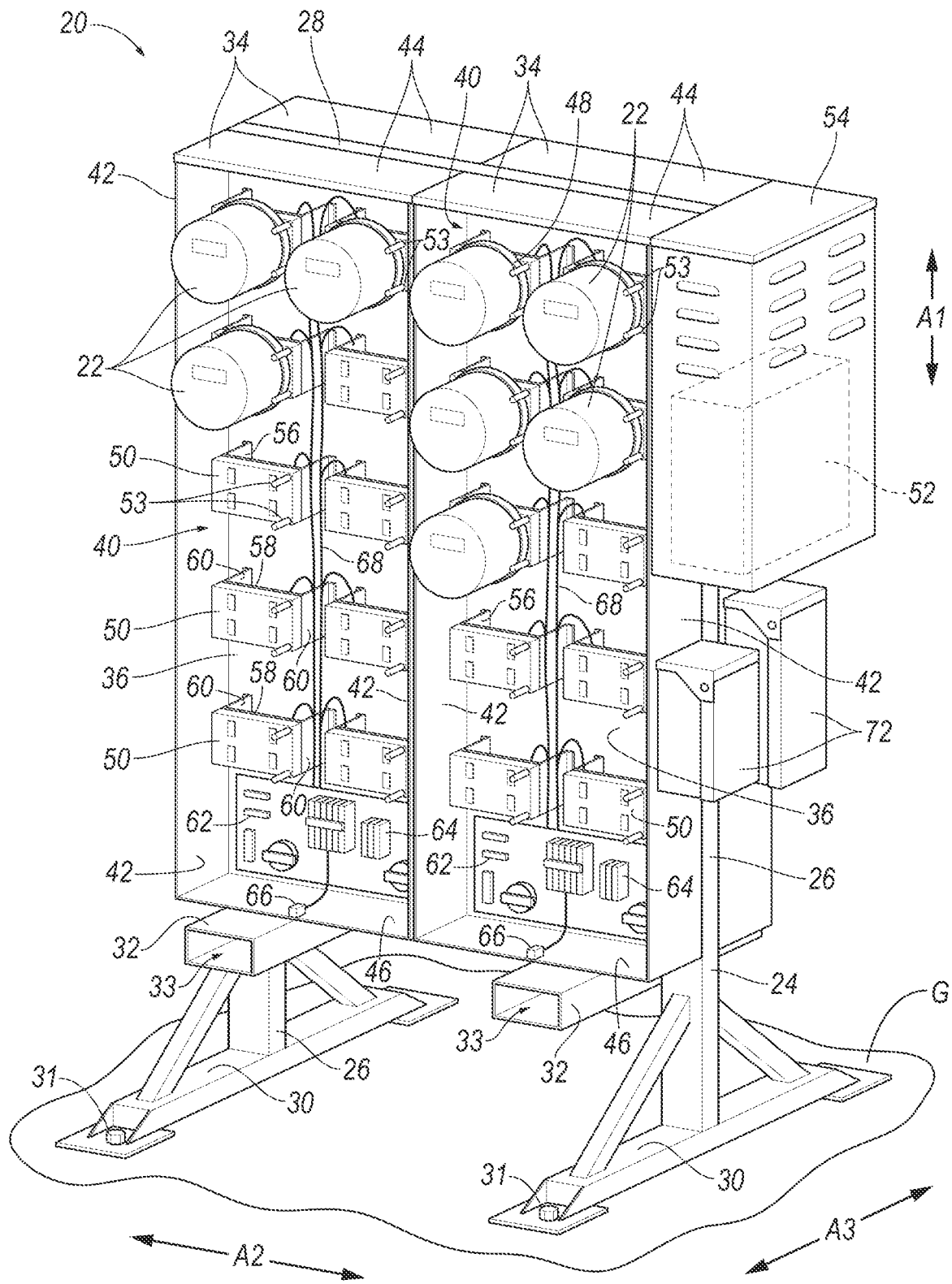
FIG. 3 is a front perspective view of the assembly with multiple electric power meters and outer panels in open positions.

The outer panels 38 may be movable between a closed position and an open position. With reference to FIGS. 1 and 2, the outer panels 38 in the closed position encloses the chamber 40. With reference to FIG. 3, the outer panels 38 do not enclose the chamber 40. For example, the outer panel 38 may be detachable from the top panel 44, the bottom panel 46, and the side panels 42, e.g., such that the outer panel 38 is detached and removed from the top panel 44, the bottom panel 46, and the side panels 42 in the open position. As another example, the outer panel 38 may be supported by the top panel 44 or one of the side panels 42 via a hinge or the like that permits the outer panel 38 to pivot between the open position and the closed position (not shown).

Figure 4:
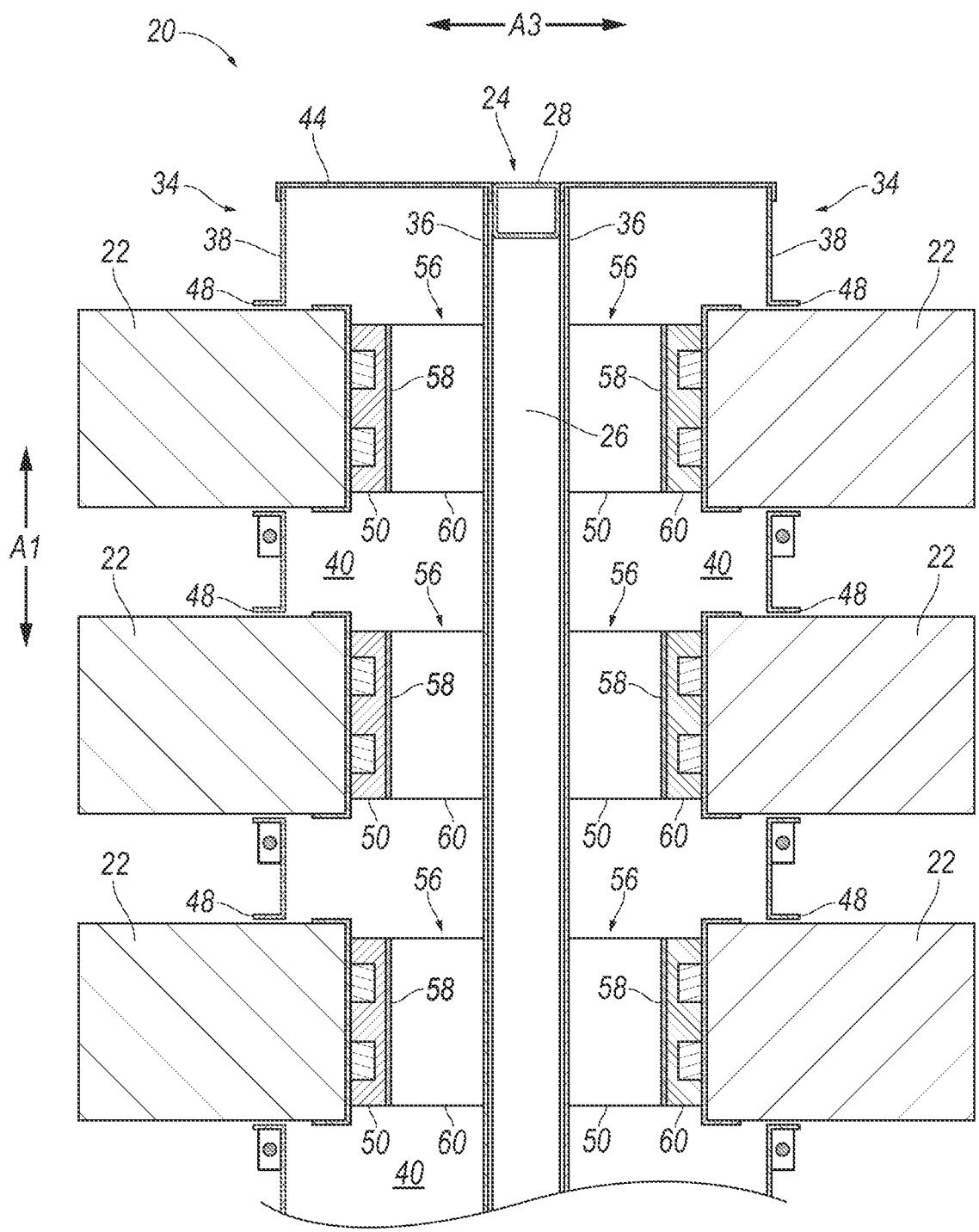
FIG. 4 is a cross-section view of the assembly taken along a line 4-4 of FIG. 1.
Figure 5:
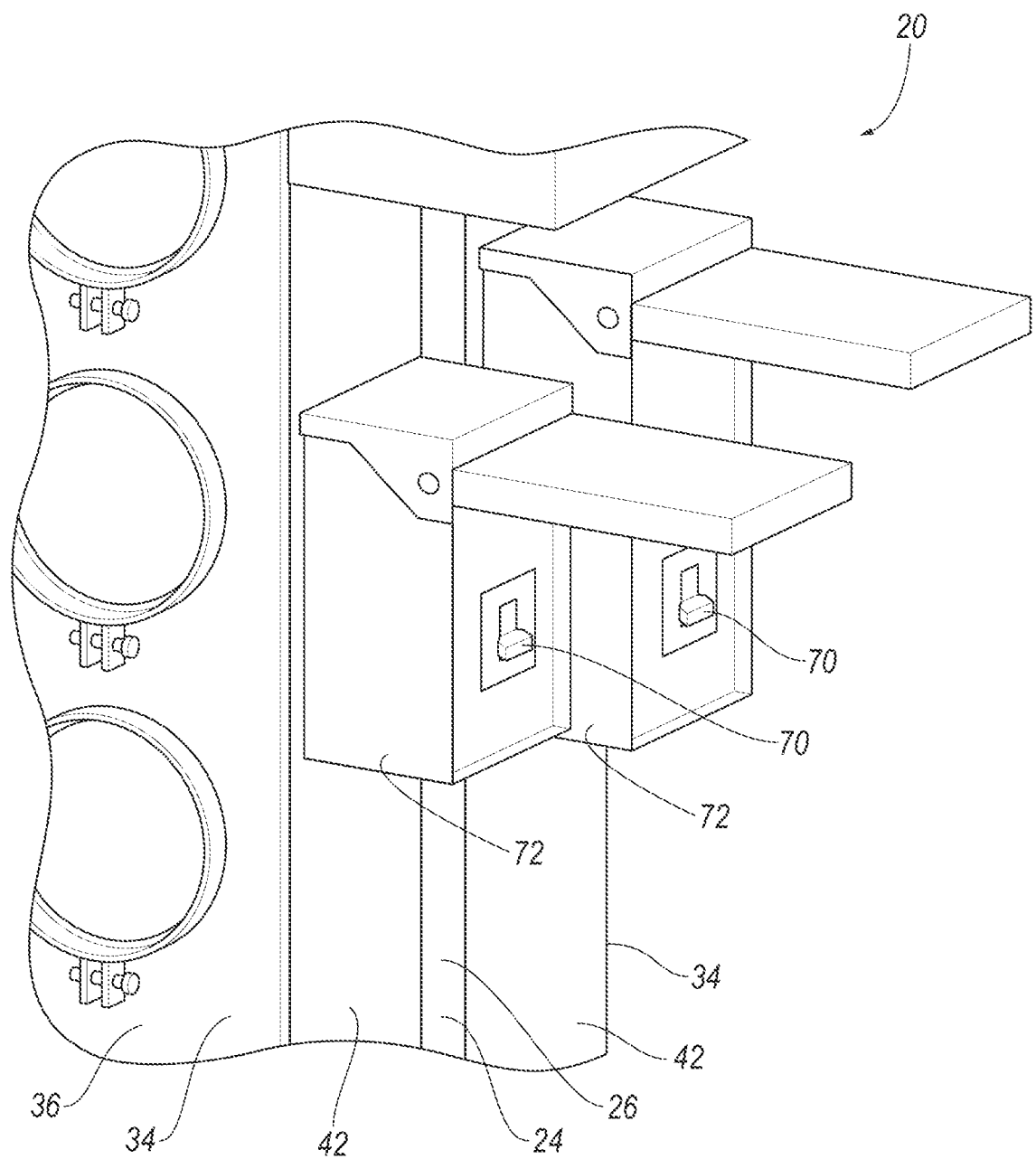
FIG. 5 is a front perspective view of a portion of the assembly.

With reference to FIGS. 3 and 4, the assembly 20 includes a plurality of meter blocks 50. The meter blocks 50 enable the meters 22 to be installed and removed, e.g., without splicing wires or other similar operation. Each meter block 50 includes a pair of line connectors that can receive electric power. For example, the line connectors of the meter blocks 50 may be hardwired to an electric power source such as a generator or power grid. Each meter block 50 includes a pair of load connectors. For example, the load connectors of the meter blocks 50 may be connected, e.g., hardwired, to an electric load 52 of the assembly 20. The line connectors and the load connectors of the meter block 50 may be female connectors. For example, the line connectors and the load connectors may each include jaws or other suitable structure for receiving a male connector. The jaws may be internal of a housing 34 of the meter block 50. The electric load 52 consumes electric power, e.g., a known rate. For example, the electric load 52 may include one or electric resistors that provide known electric resistances. The electric load 52 may be within a second housing 54 attached to one or more of the housings 34 for supporting the meters 22. The second housing 54 may be fixed to the one or more of the housings 34, for example, via fasteners or any other suitable structure.

The meter blocks 50 may include a plurality of warning lights 53. The warning lights 53 may include light emitting diodes (LEDs) or any other structure suitable for producing light. The warning lights 53 indicate whether the respective meter block 50 is energized. For example, the warning lights 53 may be connected to the load connectors and may illuminate when electric power is supplied to such load connectors. In other words, the warning lights 53 may be in an on state when the load connectors are live and in an off state when the load connectors are not live. The housings 34, e.g., the outer panels 38, may include openings, windows, or other suitable structure at the warning lights 53 that permits light produced by the warning lights 53 to be seen.

With reference to FIGS. 3 and 4, the meter blocks 50 are supported by inner panels 36 of the housings 34 within the chambers 40, e.g., between the inner panels 36 and outer panels 38, the top panels 44 and the bottom panels 46, and the side panels 42. The meter blocks 50 are at the openings 48. For example, the assembly 20 may include a plurality of brackets 56 that support the meter blocks 50 within the chambers 40. The brackets 56 may be fixed to the inner panels 36, e.g., via fasteners or the like, and each of the meter blocks 50 may be fixed to a respective one of the brackets 56. The brackets 56 may be positioned on the inner panel 36 such the meter blocks 50 fixed thereto align with the openings 48 of the outer panels 38, i.e., such that meters 22 can be connected to the meter blocks 50 through the openings 48. Each of the brackets 56 may include a main portion 58 spaced from the inner panel 36 and a pair of legs 60 extending transversely from the main portion 58 to the inner panel 36. The legs 60 may be fixed to the inner panel 36. The meter blocks 50 may be fixed to the main portions 58, e.g., with the main portion 58 and meter blocks 50 fixed thereto spaced from the inner panel 36. The spacing between the main portions 58 and the inner panel 36 enable air flow and heat dissipation between the meter blocks 50 and the inner panel 36.

With reference to FIG. 3, the assembly 20 may include a plurality of fuses 62. The fuses 62 limit an amount of electric power than can flow to the meter blocks 50. The fuses 62 may be electrically connected with the meter blocks 50. For example, the fuses 62 may be connected in line with the meter block 50 such that electricity that flows to and/or from the meter block 50 goes through the fuses 62. Multiple meter blocks 50 may be connected to each fuse 62. For example, a group of three of the meter blocks 50 may be connected to one of the fuses 62, and another group of three other of the meter blocks 50 may be connected to another of the fuses 62. The fuses 62 may be supported by, e.g., fixed to, the inner panels 36 within the chambers 40 of the housings 34.

The assembly 20 may include a plurality of electric transformers 64. The electric transformers 64 alter voltage of electric power between the meter blocks 50 and other components of the assembly 20. The transformers 64 may be electrically connected with the meter blocks 50. For example, the transformers 64 may step-down voltage of electricity between the meter blocks 50 and the electric load 52. As another example, the transformers 64 may step-down voltage of electricity going to the meter blocks 50. Multiple meter blocks 50 may be connected to each transformer 64. The transformers 64 may be within the chambers 40, e.g., fixed to the inner panels 36.

The assembly 20 may include one or more sensors 66, e.g., one sensor 66 may be supported by each of the housings 34. The sensors 66 may be fixed to the bottom panels 46 of the housings 34. The sensors 66 may be in the chambers 40. The sensors 66 detect whether the outer panel 38 of the respective housing 34 in the closed position. For example, the sensors 66 may include contact switches that open a circuit and inhibit flow of electricity to the meter blocks 50 when the outer panel 38 is in the open position and closes the circuit when the outer panel 38 is in the closed position. As another example, the sensor 66 may include an optical proximity sensor, an inductive proximity sensor, a capacitive proximity sensor, a photoelectric proximity sensor, or other suitable structure.

Wiring 68 connects various components in the housings 34, e.g., the sensors 66, the fuses 62, the transformers 64, etc., to the meter blocks 50. The wiring 68 is disposed within the chambers 40 of the housings 34. The housings 34 protect the wiring, e.g., without requiring conduit for the wiring.

With reference to FIGS. 1-3 and 5, the assembly 20 may include one or more circuit breakers 70. The circuit breakers 70 control flow of electric power to the to the electrical components, e.g., the meter blocks 50, the fuses 62, the transformers 64, etc. For example, one circuit breaker 70 may be connected to the electrical components of one of the housings 34 and another circuit breaker 70 may be connected to the electrical components of another of the housings 34. Each circuit breaker 70 may be supported within a respective a third housing 72. The third housings 72 may be fixed to the housings 34 containing the electrical components.

The disclosure has been described in an illustrative manner, and it is to be understood that the terminology which has been used is intended to be in the nature of words of description rather than of limitation. The numerical terms adverbs "first" and "second" are used herein merely as identifiers and do not signify order or importance. Many modifications and variations of the present disclosure are possible in light of the above teachings, and the disclosure may be practiced otherwise than as specifically described.

What is claimed is:

1. An assembly, comprising:
   a frame;
   a housing supported by the frame, the housing having an inner panel and an outer panel, the inner panel is between the frame and the outer panel and is fixed to the frame, the housing defining a chamber between the inner panel and the outer panel, the outer panel defining a plurality of openings open to the chamber, the housing having a top panel, a bottom panel, and a pair of side panels that all extend from the inner panel to the outer panel and further define the chamber;
   a second housing having a second inner panel and a second outer panel, the second housing defining a second chamber between the second inner panel and the second outer panel, the second outer panel defining a plurality of second openings open to the second chamber, the second inner panel fixed to the frame;
   a plurality of meter blocks supported by the inner panel of the housing within the chamber, the meter blocks at the openings; and
   a plurality of second meter blocks supported by the second inner panel of the second housing within the second chamber, the second meter blocks at the second openings.

2. The assembly of claim 1, further comprising a plurality of meters at the openings and connected to the meter blocks.

3. The assembly of claim 1, further comprising a plurality of fuses supported by the inner panel within the chamber, the fuses connected to the meter blocks.

4. The assembly of claim 3, further comprising a plurality of electric transformers within the chamber and connected to the meter blocks.

5. The assembly of claim 1, further comprising a sensor supported by the housing in the chamber and configured to detect the outer panel in a closed position.

6. The assembly of claim 1, further comprising a plurality of brackets fixed to the inner panel, the meter blocks fixed to the brackets.

7. The assembly of claim 1, further comprising a second housing and an electric load, the second housing supported by the frame, the electric load supported within the second housing and connected to the meter blocks, the electric load including an electrical resistor that provides a known resistance.

8. The assembly of claim 1, further comprising a second housing supported by the frame and a circuit breaker supported within the second housing, the circuit breaker connected to the meter blocks.

9. The assembly of claim 1, wherein the frame is outside the chamber and is separated from the chamber by the inner panel.

10. The assembly of claim 1, wherein the frame includes a pair of fork receivers.

11. The assembly of claim 10, wherein the fork receivers each include an elongated hollow beam with an open end.

12. The assembly of claim 11, wherein the frame includes a pair of feet elongated parallel to the fork receivers.

13. The assembly of claim 1, wherein the frame includes a pair of feet that support the assembly in a freestanding position.

14. The assembly of claim 13, wherein the feet are releasably fixed to ground on which the assembly is placed.

15. The assembly of claim 1, wherein the frame is between the housing and the second housing.

16. The assembly of claim 1, wherein the meter blocks include warning lights.

17. An assembly, comprising:
    a housing having an inner panel and an outer panel, the housing defining a chamber between the inner panel and the outer panel, the outer panel defining a plurality of openings open to the chamber;
    a plurality of brackets fixed to the inner panel, each bracket of the plurality brackets including a main portion spaced from the inner panel and a pair of legs extending from the main portion to the inner panel; and
    a plurality of meter blocks supported by the inner panel of the housing within the chamber, the meter blocks at the openings and fixed to the main portions of the brackets.

* * * * *